United States Patent
Fogel et al.

(10) Patent No.: US 9,716,207 B2
(45) Date of Patent: Jul. 25, 2017

(54) LOW REFLECTION ELECTRODE FOR PHOTOVOLTAIC DEVICES

(71) Applicant: GLOBALFOUNDRIES INC., Grand Cayman (KY)

(72) Inventors: Keith E. Fogel, Hopewell Junction, NY (US); Jeehwan Kim, White Plains, NY (US); David B. Mitzi, Mahopac, NY (US); Mark T. Winkler, New York, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 695 days.

(21) Appl. No.: 13/948,645

(22) Filed: Jul. 23, 2013

(65) Prior Publication Data
US 2015/0027521 A1   Jan. 29, 2015

(51) Int. Cl.
*H01L 21/00* (2006.01)
*H01L 31/18* (2006.01)
(Continued)

(52) U.S. Cl.
CPC .... *H01L 31/1888* (2013.01); *H01L 31/02366* (2013.01); *H01L 31/022483* (2013.01);
(Continued)

(58) Field of Classification Search
CPC ............. H01L 31/1888; H01L 31/0326; H01L 31/0749; H01L 31/022483;
(Continued)

(56) References Cited

U.S. PATENT DOCUMENTS

| 4,268,347 A | 5/1981 | Stephens |
| 6,759,645 B2 | 7/2004 | Tawada et al. |

(Continued)

FOREIGN PATENT DOCUMENTS

| EP | 2561548 | 2/2012 |
| WO | WO2011131634 A1 | 10/2011 |

(Continued)

OTHER PUBLICATIONS

Halper, M. "Black Power: Dark Solar Cell Smashes Record for Absorbing Photons" www.smartplanet.com. May 2012. (2 Pages) Available at: http://www.smartplanet.com/blog/intelligent-energy/black-power-dark-solar-cellsmashes-record-for-absorbing-photons/15482.

*Primary Examiner* — Julio J Maldonado
*Assistant Examiner* — Stanetta Isaac
(74) *Attorney, Agent, or Firm* — Anthony Canale; Hoffman Warnick LLC (57) ABSTRACT

A method for forming a photovoltaic device includes forming a photovoltaic absorption stack on a substrate including one or more of I-III-$VI_2$ and $I_2$-II-IV-$VI_4$ semiconductor material. A transparent conductive contact layer is deposited on the photovoltaic absorption stack at a temperature less than 200 degrees Celsius. The transparent conductive contact layer has a thickness of about one micron and is formed on a front light-receiving surface. The surface includes pyramidal structures due to an as deposited thickness. The transparent conductive contact layer is wet etched to further roughen the front light-receiving surface to reduce reflectance.

17 Claims, 6 Drawing Sheets

(51) Int. Cl.
*H01L 31/0224* (2006.01)
*H01L 31/0236* (2006.01)
*H01L 31/032* (2006.01)
*H01L 31/0749* (2012.01)

(52) U.S. Cl.
CPC ...... *H01L 31/0326* (2013.01); *H01L 31/0749* (2013.01); *Y02E 10/541* (2013.01)

(58) Field of Classification Search
CPC ....... H01L 31/02366; H01L 31/022466; H01L 31/022475; H01L 2251/305; H01L 25/047; H01L 31/04; H01L 31/0443; H01L 31/0445; Y02E 10/541
See application file for complete search history.

(56) References Cited

U.S. PATENT DOCUMENTS

| | | | |
|---|---|---|---|
| 7,161,171 | B2 | 1/2007 | Dahmani et al. |
| 8,187,979 | B2 | 5/2012 | Ramappa et al. |
| 8,203,071 | B2 | 6/2012 | Sheng et al. |
| 2008/0072958 | A1* | 3/2008 | Dutta .................. H01L 31/0236 136/256 |
| 2011/0036399 | A1 | 2/2011 | Lin et al. |
| 2011/0151610 | A1* | 6/2011 | Ramappa .......... H01J 37/32366 438/57 |
| 2011/0220197 | A1 | 9/2011 | Myong |
| 2012/0015147 | A1 | 1/2012 | Maa et al. |
| 2012/0152346 | A1 | 6/2012 | Yang et al. |
| 2012/0285522 | A1 | 11/2012 | Sommer et al. |
| 2013/0025651 | A1* | 1/2013 | Matsuura .......... H01L 31/02248 136/249 |
| 2013/0112257 | A1* | 5/2013 | Isom .................... H01L 31/048 136/256 |
| 2013/0167920 | A1* | 7/2013 | Chang ............... H01L 31/02168 136/256 |

FOREIGN PATENT DOCUMENTS

| | | |
|---|---|---|
| WO | WO2012031102 A2 | 3/2012 |
| WO | WO2012031102 A3 | 3/2012 |
| WO | WO2012087759 A1 | 6/2012 |

* cited by examiner

LOW REFLECTION ELECTRODE FOR PHOTOVOLTAIC DEVICES

BACKGROUND

Technical Field

The present invention relates to photovoltaic devices, and more particularly to a conductive electrode having increased thickness and roughness to reduce and virtually eliminate surface reflection.

Description of the Related Art

With growing concern about low cost clean energy, solar power has again become a focal point for alternatives to fossil fuel energy production. Solar energy, while clean and sustainable, typically relies on expensive technologies for its implementation. These technologies include the incorporation of integrated circuits or integrated circuit technology into the fabrication of solar cells. The expense associated with current solar panels is a strong disincentive from moving in the direction of solar power.

Solar panels employ photovoltaic cells to generate current flow. When a photon hits a solar cell, the photon may be transmitted through, reflected off, or absorbed by the solar cell if the photon energy is higher than the material band gap value. This generates an electron-hole pair and sometimes heat, depending on the band structure. The greater the absorption the greater the efficiency of the cell.

Textured structures have been employed to increase the absorption efficiency. However, challenges arise at several points in the process. One such problem includes the formation of a bottom electrode. A bottom electrode deposition occurs by forming a layer of electrode material and deep reactive ion etching (DRIE) the material to attempt to conform the bottom electrode material to the shape of the underlying structure. DRIE is a highly anisotropic etch process making the formation of the bottom electrode highly sensitive to thickness variations. A bottom electrode that is too thin results in series resistance problems and affects the efficiency of the solar cell.

SUMMARY

A method for forming a photovoltaic device includes forming a photovoltaic absorption stack on a substrate including one or more of I-III-VI$_2$ and I$_2$-II-IV-VI$_4$ semiconductor material. A transparent conductive contact layer is deposited on the photovoltaic absorption stack at a temperature less than 200 degrees Celsius. The transparent conductive contact layer has a thickness of about one micron and is formed on a front light-receiving surface. The surface includes pyramidal structures due to an as deposited thickness. The transparent conductive contact layer is wet etched to further roughen the front light-receiving surface to reduce reflectance.

Another method for forming a photovoltaic device includes depositing a first contact on a substrate; forming an absorber layer on the first contact, the absorber layer including at least one of Cu$_2$ZnSn(S,Se)$_4$ (CZTSSe) and CuIn$_x$Ga$_{1-x}$(S,Se)$_2$ (CIGSSe); forming a buffer layer on the absorber layer; depositing a transparent conductive contact layer on the buffer layer at a temperature less than 200 degrees Celsius, the transparent conductive contact layer having a thickness of about one micron and being formed on a front light-receiving surface; and wet etching the transparent conductive contact layer to further roughen the front light-receiving surface to reduce reflectance.

A photovoltaic device includes a first contact and an absorber layer including at least one of Cu$_2$ZnSn(S,Se)$_4$ (CZTSSe) and CuIn$_x$Ga$_{1-x}$(S,Se)$_2$ (CIGSSe). A transparent conductive contact layer is formed on the absorber layer, the transparent conductive contact layer having a thickness of about one micron and being formed on a front light-receiving surface. The front light-receiving surface has a reflectance of less than 0.04 over the visible spectrum due to a roughness of the transparent conductive contact layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, photovoltaic devices and methods for fabricating photovoltaic devices are provided. The present embodiments form a thick transparent conductive electrode (TCE) on a Cu$_2$(Zn,Sn)(S,Se)$_4$ (CZTSSe) layer or CuIn$_x$Ga$_{1-x}$(S,Se)$_2$ (CIGSSe) layer of a photovoltaic device. The TCE preferably includes a transparent conductive oxide, such as ZnO doped with Al (ZnO:Al or AZO). The ZnO:Al preferably includes a thickness of greater than about one micron. The thick ZnO:Al has an increased roughness over thinner materials and provides a highly non-reflective front surface. To further increase the surface roughness an acid etch may be performed on the ZnO:Al electrode using, e.g., HCl.

Pyramidal surfaces using boron doped ZnO (BZO, ZnO:B) employ high temperature processing (e.g., T>200 degrees C.). Such temperatures can negatively impact solar cell efficiency, especially using materials such as CIGSSe, CZTSSe. High temperature processing is often more expensive.

In accordance with the present principles, a low reflectance electrode is provided using low temperature processing. The low temperature process may include sputtering, where an AZO material can be deposited thick enough to create a pyramidal surface. Subsequent etching can create even more surface features (increasing aspect ratio) so that less reflection is achieved than for high temperature processing of other materials.

It is to be understood that the present invention will be described in terms of given illustrative architectures for a solar cell; however, other architectures, structures, substrate materials and process features and steps may be varied within the scope of the present invention.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., Cu—Zn—Sn—S(Se) (CZTSSe), CuInGaS(Se), (CIGSSe), ZnO, etc. The compounds described herein may include different proportions of the elements within the compound, e.g., $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$, $CuIn_xGa_{1-x}(S,Se)_2$ wherein $0 \leq x \leq 1$, etc. In addition, other elements may be included in the compound, such as, e.g., dopants, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention may be employed in a tandem (multi-junction) structure. Other architectures, structures, substrate materials and process features and steps may be varied within the scope of the present invention. The tandem structure may include one or more stacked cells.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
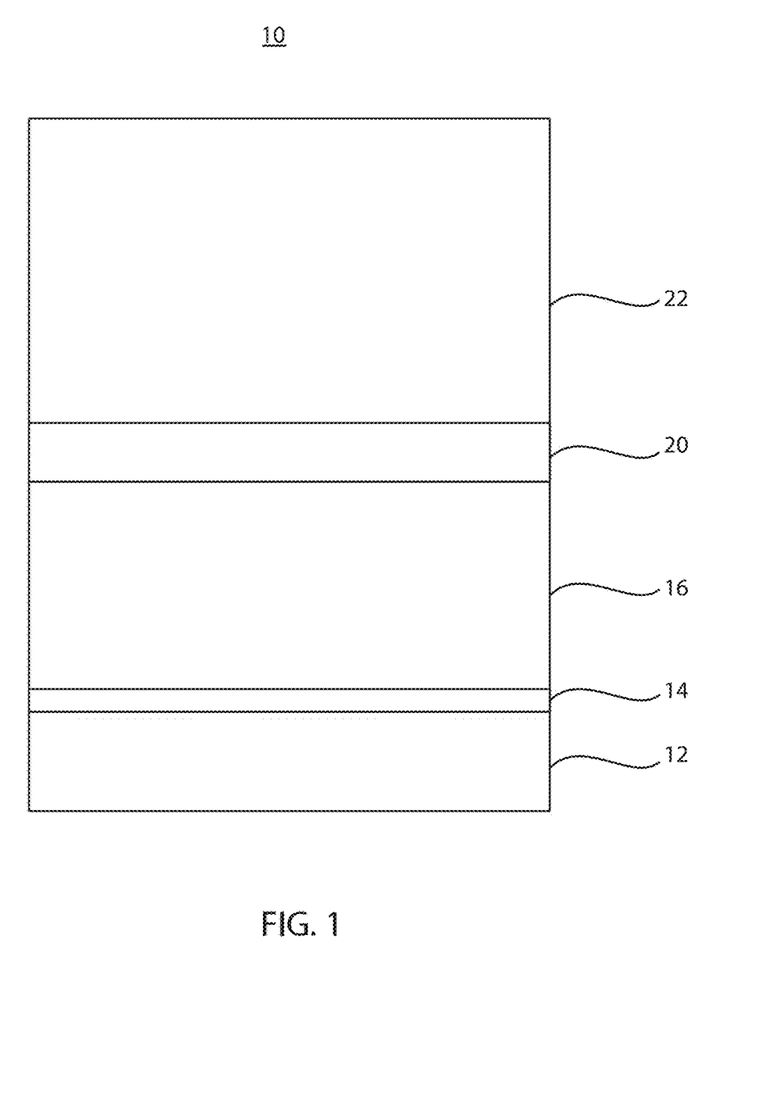
FIG. 1 is a cross-sectional view of a photovoltaic device having a low-reflectance light receiving surface in accordance with the present principles.

Referring now to the drawings in which like numerals represent the same or similar elements and initially to FIG. 1, an illustrative photovoltaic structure 10 is illustratively depicted in accordance with one embodiment. The photovoltaic structure 10 may be employed in solar cells, light sensors, photosensitive devices or other photovoltaic applications. The structure 10 includes a substrate 12. The substrate 12 may include glass or other inexpensive substrate, such as metal, plastic or other material suitable for photovoltaic devices (e.g., quartz, silicon, etc.). A conductive layer 14 is formed on the substrate 12. The conductive layer 14 may include molybdenum although other high work-function materials may be employed (e.g., Pt, Au, etc.). The layer 14 provides a metal contact.

An absorber layer 16 includes a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ (hereinafter CZTSSe), although other $I_2$-II-IV-VI$_4$ or I-III-VI$_2$ (e.g., CIGSSe) semiconductors may be employed.

In a particularly useful embodiment, the Cu—Zn—Sn-containing chalcogenide includes $Cu_2ZnSn(S,Se)_4$. In one embodiment, the CZTSSe film or layer 16 has a thickness of between about 0.2 to 4.0 microns and more preferably about 2 microns. Layer 16 may be formed by painting, sputtering, co-evaporation, electroplating, spin coating, slit casting, doctor blading, dip coating or other simple coating processes. In one illustrative embodiment, layer 16 includes CZTS (or CZTS with some Se substituted for S) which provides a band gap ($E_g$) from about 1 to 1.5 eV. Although the major elements in CZTS are Cu, Zn, Sn, S, Se, reference to CZTSSe or Cu—Zn—Sn containing chalcogenide material also includes compositions that optionally contain Ge replacing some or all of the Sn and that may also contain other dopants, including Sb, Bi, Na, K, Li, Ca, etc.

CZTSSe has many benefits. It is low cost and environmentally harmless, being fabricated using naturally abundant materials. CZTSSe provides good optical properties and has a band-gap energy from approximately 1 to 1.5 eV, depending on the degree of substitution of S with Se, and a large absorption coefficient in the order of $10^4$ cm$^{-1}$. Reducing the reliance on rare indium metal (also heavily consumed by one of the fastest growing industries—thin film displays) opens the possibility of almost limitless material supply. Other materials may be employed for the absorber layer 16 as well. For example, a I-III-VI$_2$ semiconductor material (e.g., Cu—In—Ga—S/Se (CIGSSe)), etc. may also be employed.

A buffer layer 20 may be formed on layer 16. The buffer layer 20 may include CdS, which forms a high quality junction with layer 16, although other materials may be employed.

A transparent conductive layer 22 is formed over layer 16 or the buffer 20 if present. The transparent conductive layer 22 may include a transparent conductive oxide (TCO), such as, e.g., aluminum doped zinc oxide (AZO) or other TCO materials, which can be processed at low temperatures (e.g., less than about 200 degrees C. The transparent conductive layer 22 may include a thickness of greater than about one micron. The thickness of the transparent conductive layer 22 may be as high as 5 microns. The high thickness of the transparent conductive layer 22 yields pyramidal structures that contributes to high surface roughness, with structures as large as, on average, 0.5 to about 1.5 microns in size (see FIG. 2), although other sizes may be achieved depending on the processing parameters employed.

The deposition process for forming the transparent conductive layer 22 may include a sputtering process, an evaporation process, a low temperature plasma enhanced chemical vapor deposition (PECVD) process or other suitable deposition process. The transparent conductive layer 22 forms a light receiving electrode for the device.

Metal contacts may be formed on the transparent conductive layer 22 to further enhance the conductive properties of the transparent conductive layer 22. However, such metal contacts are not needed due to the large thickness of the transparent conductive layer 22.

Figure 2:
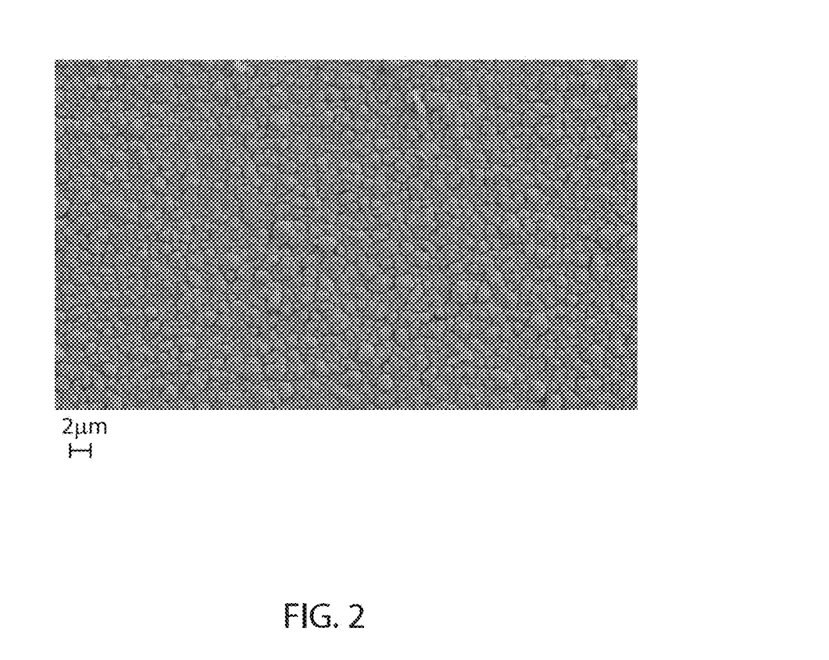
FIG. 2 is a scanning electron microscope (SEM) image showing a top view of a photovoltaic device with pyramidal structures formed thereon due to the deposition thickness in accordance with the present principles.

Referring to FIG. 2, a scanning electron microscope (SEM) image 200 shows a top view of a device having a thick transparent conductive layer 22 formed thereon from AZO. The image 200 shows pyramidal structures formed as a result of the thickness of the AZO material. The pyramidal structures have an average diameter between about 0.5 to about 1.5 microns in size.

Figure 3:
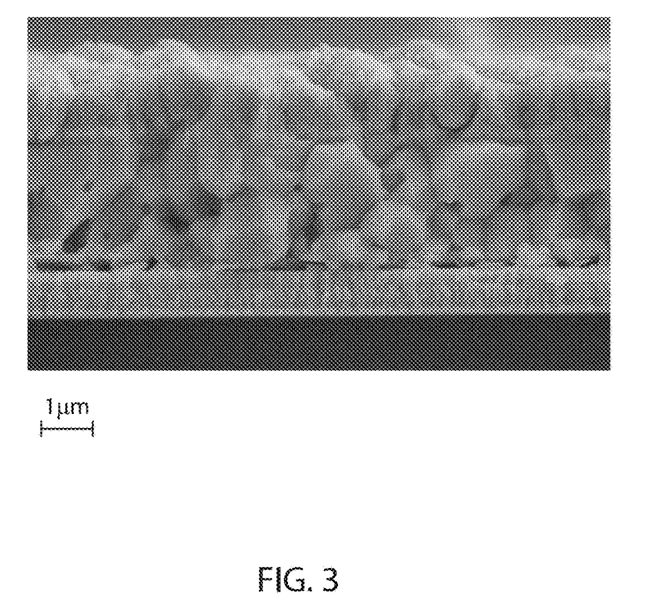
FIG. 3 is a SEM image showing a cross-sectional view of the photovoltaic device of FIG. 2 showing the pyramidal structures formed therein due to the deposition thickness in accordance with the present principles.

Referring to FIG. 3, a scanning electron microscope (SEM) image 300 shows a top view of a device having a thick transparent conductive layer 22 formed thereon from AZO. The image 300 shows pyramidal structures formed on a planar layer of CZTS. The transparent conductive layer 22 has a thickness of between 4.5 to about 5 microns with large pyramidal crystals having an average diameter between about 0.5 to about 1.5 microns in size.

Referring again to FIG. 1, a wet etch process is employed to increase the roughness of the, as deposited, transparent conductive layer 22. The wet etching process results in the narrowing of the pyramidal shapes of the transparent conductive layer 22 (increasing aspect ratio). The wet etching process may include a hydrochloric acid (HCl) although other etchants may be employed, e.g., HF, HNO$_3$, etc. In one embodiment, a diluted HCl wet etch is employed. The dilution of H$_2$O:HCl may be from 990:10 to about 999:1, and preferably about 995:5. The wet etching may be performed for a duration of between about 10 seconds to about 120 seconds. In addition, the wet etching process provides better process control for the transparent conductive layer 22 thickness and is much more inexpensive than deep reactive ion etching. The transparent conductive layer 22 in this embodiment, forms a three-dimensional electrode and includes a textured surface as a result of the properties of the transparent conductive layer 22

Figure 4:
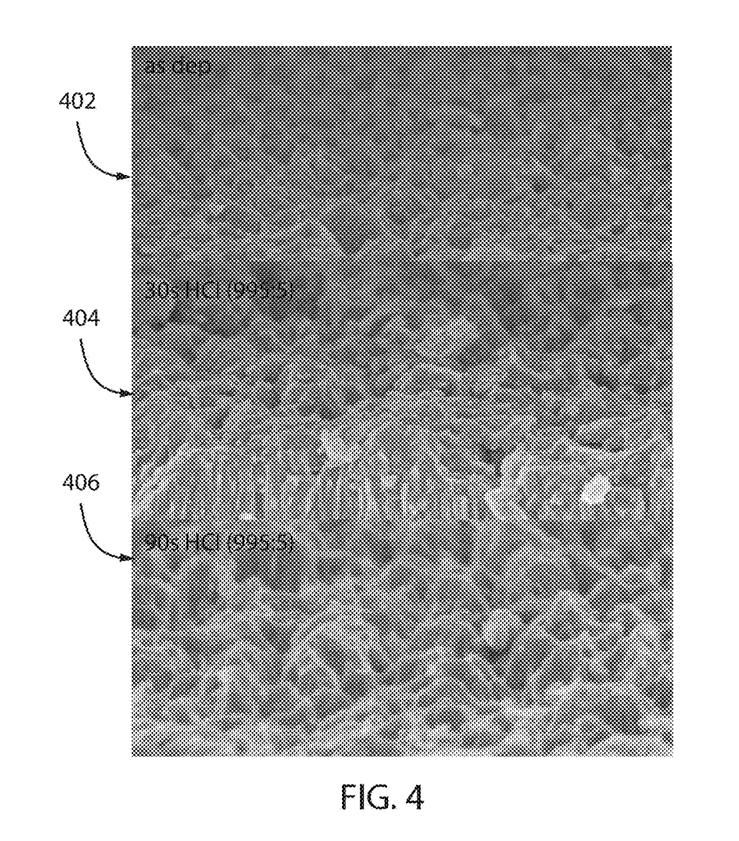
FIG. 4 shows SEM images of a top view of a photovoltaic device as deposited, after 30 seconds of wet etching and after 90 seconds of wet etching in accordance with the present principles.

Referring to FIG. 4, scanning electron microscope (SEM) images 402, 404 and 406 show a top view of a device having a thick transparent conductive layer 22 formed thereon from AZO. Image 402 shows an as deposited 3 micron thick transparent conductive layer 22. Image 404 shows the same device after 30 seconds of being wet etched with diluted 995:5 HCl. The pyramidal structures are sharper resulting in reduced overall reflectance of the surface. Image 406 shows the same device after 90 seconds of being wet etched with diluted 995:5 HCl. The pyramidal structures are sharpened further resulting in further reductions in overall reflectance of the surface.

Figure 5:
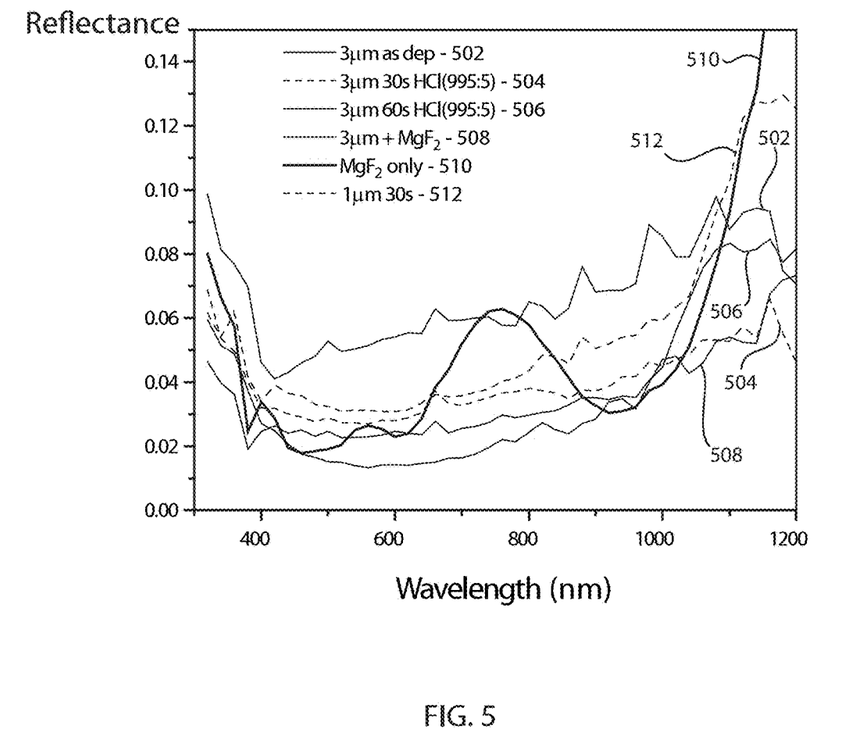
FIG. 5 is a graph showing reflectance versus wavelength (nm) for devices having a transparent conductive layer formed under different conditions in accordance with the present principles.

Referring to FIG. 5, reflectance is plotted against wavelength for a number of different devices. Plot 502 shows a photovoltaic cell having a thick TCO layer (AZO) with a thickness of 3 microns, as deposited. Plot 504 shows a photovoltaic cell having a thick TCO layer (AZO) with a thickness of 3 microns, as deposited, and etched with 995:5 HCl for 30 seconds. Plot 506 shows a photovoltaic cell having a thick TCO layer (AZO) with a thickness of 3 microns, as deposited, and etched with 995:5 HCl for 60 seconds. Plot 508 shows a photovoltaic cell having a thick TCO layer (AZO) with a thickness of 3 microns, as deposited, and an antireflection coating of MgF$_2$ formed thereon. Plot 510 shows a photovoltaic cell having an antireflection coating of MgF$_2$ only formed thereon. Plot 512 shows a photovoltaic cell having a thick TCO layer (AZO) with a thickness of 1 micron, as deposited, and etched with 995:5 HCl for 30 seconds. It should be noted that thickness of about 1 micron may be employed (e.g., 0.8 microns and higher) and still benefit from the present principles.

Plot 506 shows the thick TCO layer (AZO) (3 microns) etched with 995:5 HCl for 60 seconds to be comparable to an anti-reflection coating with an overall reflectance of less than 0.04 over the visible range, e.g., 390 nm to 700 nm. In many cases, the reflectance is less than about 0.03. Plot 512 shows the 1 micron thick TCO layer (AZO) etched with 995:5 HCl for 30 seconds to also provide low reflectance.

Figure 6:
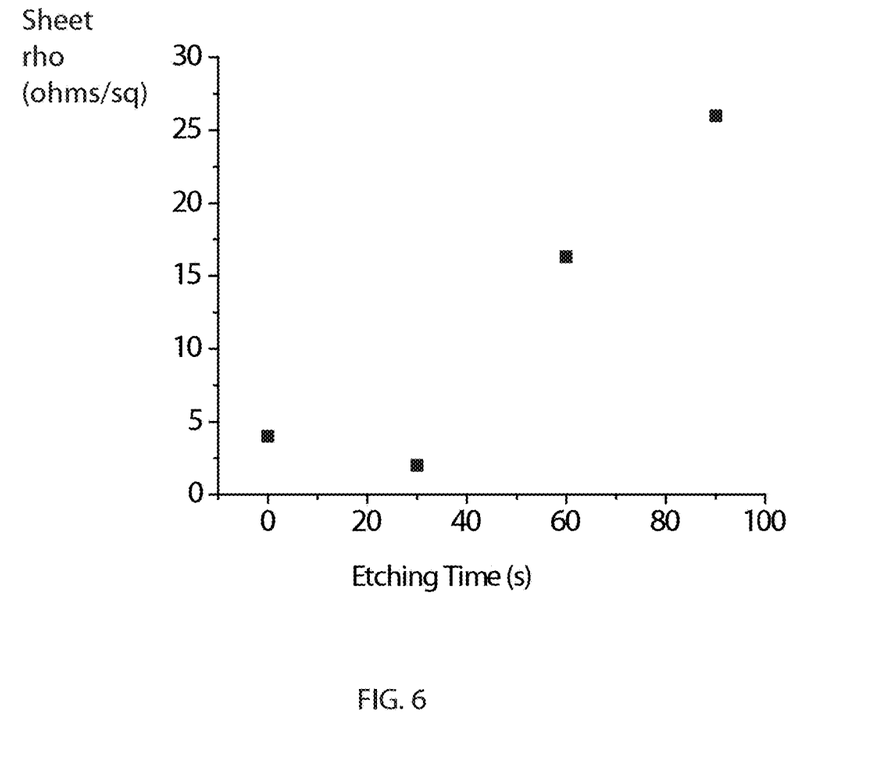
FIG. 6 is a graph showing sheet resistance by plotting sheet resistivity (ohms/square) versus wet etching times (seconds) for a transparent conductive layer conditions in accordance with the present principles.

Referring to FIG. 6, a plot of sheet resistivity (ρ or rho) in ohms/square versus etching time in seconds is shown for a 3 micron thick AZO transparent conductor. The etching includes 995:5 HCl wet etching. While resistivity increases with etching times, the resistivity is weighted against reflectance such that about 60 seconds (e.g., 50 to 70 seconds) of etching provides an excellent balance between the reflectance and the resistivity.

Figure 7:
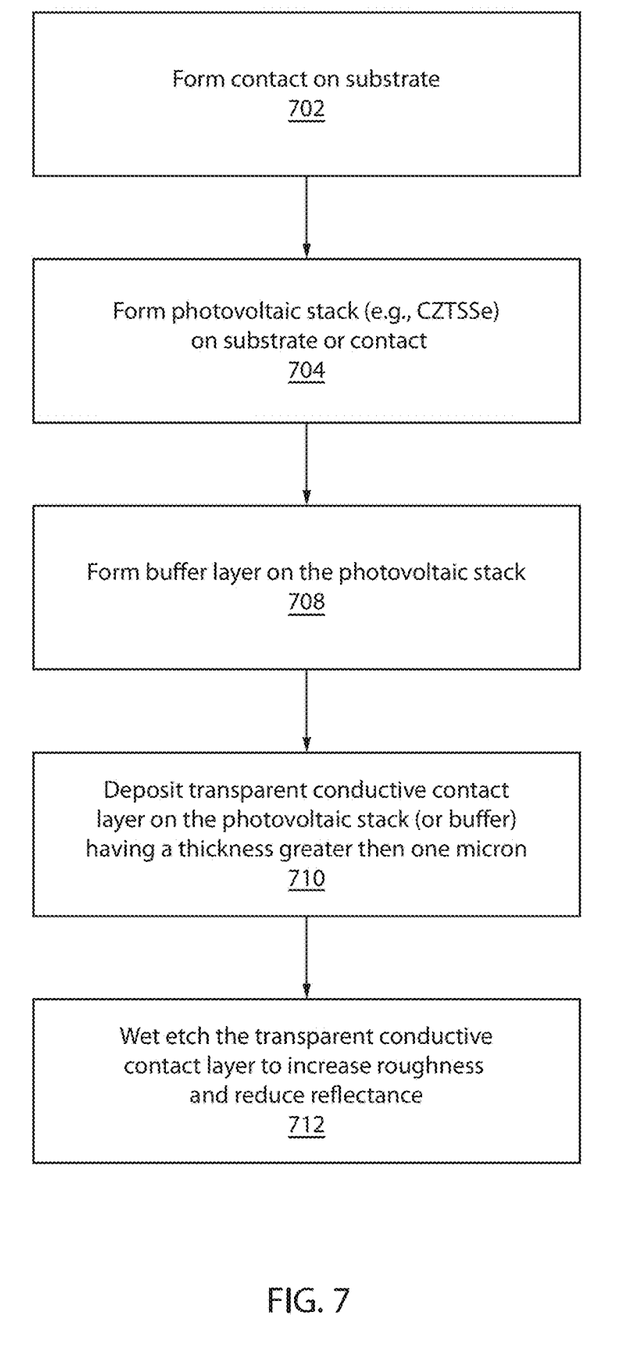
FIG. 7 is a block/flow diagram showing a method for fabricating a photovoltaic device in accordance with illustrative embodiments.

Referring to FIG. 7, a method for forming a photovoltaic device is illustratively shown in accordance with the present principles. The flowchart and block diagrams in the Figures illustrate the architecture, functionality, and operation of possible implementations of systems, and methods according to various embodiments of the present invention. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 702, a first contact is deposited on a substrate. In block 704, a photovoltaic absorption stack may be deposited on the first contact/substrate. The photovoltaic absorption stack may include an absorber layer. The absorber layer may include a Cu—Zn—Sn—S(Se) (CZTSSe) layer. Other photovoltaic technologies and materials may also be employed (e.g., CIGSSe, etc.). In block 708, a buffer layer may be formed on the photovoltaic absorption stack (e.g., on the absorber layer). In block 710, a transparent conductive contact layer is deposited on the buffer layer with a thickness of over one micron, and, preferably, between about 1 micron to about 5 microns. The transparent conductive contact layer is formed on a front light-receiving surface. The transparent conductive contact layer is formed by a low temperature process (e.g., less than about 200 degrees C., and may include sputtering, PEVD, etc. The transparent conductive contact layer may include an aluminum doped zinc oxide (AZO) layer, although other transparent conductive oxides may be employed, if pyramidal structures are formed and low temperature deposition can be employed.

In block 712, the transparent conductive contact layer is wet etched to further roughen the front light-receiving surface. The wet etching may include an acid etchant and may include diluted HCl having a dilution ratio of water to acid of between 990:10 and 999:1. The wet etching may be performed for between 30 seconds and 90 seconds, and preferably between 50 seconds and 70 seconds. After wet etching, the front light-receiving surface may include a reflectance of less than 0.06 over the visible spectrum (390 nm-700 nm), and preferably less than about 0.04 over the visible spectrum.

In accordance with the present principles, a photovoltaic device is provided with a textured low reflectance top transparent electrode for complex semiconductor material (e.g., I-III-VI$_2$, I$_2$-II-IV-VI$_4$, etc.) photovoltaic devices. Due to the complicated structures of these semiconductor materials, low temperature processing needs to be performed to maintain device efficiency. By employing a low temperature deposition material, such as AZO on the semiconductor materials (CZTSSe, CIGSSe, etc.), the device structure and function can be preserved while providing a low reflectance top electrode.

Having described preferred embodiments for a low reflection electrode for photovoltaic devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a photovoltaic device, comprising:
   forming a photovoltaic absorption stack on a substrate including one or more of I-III-VI$_2$ and I$_2$-II-IV-VI$_4$ semiconductor material;
   after the forming, depositing a transparent conductive contact layer on the photovoltaic absorption stack at a temperature less than 200 degrees Celsius, the transparent conductive contact layer having a thickness of about one micron and being formed on a front light-receiving surface, the surface including pyramidal structures due to an as deposited thickness; and
   after the depositing, wet etching the transparent conductive contact layer to further roughen the front light-receiving surface to reduce reflectance.

2. The method as recited in claim 1, wherein depositing the transparent conductive contact layer includes depositing an aluminum doped zinc oxide (AZO) layer.

3. The method as recited in claim 1, wherein depositing the transparent conductive contact layer includes depositing the transparent conductive contact layer to a thickness of between about 1 micron to about 5 microns.

4. The method as recited in claim 1, wherein wet etching includes an acid etchant.

5. The method as recited in claim 4, wherein the acid etchant includes diluted HCl having a dilution ratio of water to acid of between 990:10 and 999:1.

6. The method as recited in claim 5, wherein wet etching is performed for between 30 seconds and 90 seconds.

7. The method as recited in claim 5, wherein wet etching is performed for between 50 seconds and 70 seconds.

8. The method as recited in claim 1, wherein the front light-receiving surface includes a reflectance of less than 0.04 over the visible spectrum.

9. The method as recited in claim 1, wherein pyramidal structures include an average size of between about 0.5 and 1.5 microns.

10. A method for forming a photovoltaic device, comprising:
    depositing a first contact on a substrate;
    forming an absorber layer on the first contact, the absorber layer including at least one of Cu$_2$ZnSn(S,Se)$_4$ (CZTSSe) and CuIn$_x$Ga$_{1-x}$(S,Se)$_2$ (CIGSSe);
    forming a buffer layer on the absorber layer;
    after the forming the buffer layer, depositing a transparent conductive contact layer on the buffer layer at a temperature less than 200 degrees Celsius, the transparent conductive contact layer having a thickness of about one micron and being formed on a front light-receiving surface; and
    after the depositing the transparent conductive contact layer, wet etching the transparent conductive contact layer to further roughen the front light-receiving surface to reduce reflectance.

11. The method as recited in claim 10, wherein depositing the transparent conductive contact layer includes depositing an aluminum doped zinc oxide (AZO) layer.

12. The method as recited in claim 10, wherein depositing the transparent conductive contact layer includes depositing the transparent conductive contact layer to a thickness of between about 1 micron to about 5 microns.

13. The method as recited in claim 10, wherein wet etching includes an acid etchant.

14. The method as recited in claim 13, wherein the acid etchant includes diluted HCl having a dilution ratio of water to acid of between 990:10 and 999:1.

15. The method as recited in claim 14, wherein wet etching if performed for between 30 seconds and 90 seconds.

16. The method as recited in claim 15, wherein wet etching if performed for between 50 seconds and 70 seconds.

17. The method as recited in claim 10, wherein the front light-receiving surface includes a reflectance of less than 0.04 over the visible spectrum.

* * * * *